United States Patent [19]
Lofthouse-Zeis et al.

[11] Patent Number: 5,754,574
[45] Date of Patent: May 19, 1998

[54] TEMPERATURE CORRECTION CIRCUIT FOR WAVELENGTH STABILIZATION IN A LASER DIODE

[75] Inventors: Jay T. Lofthouse-Zeis, San Ramon; John K. Johnson, Sunnyvale, both of Calif.

[73] Assignee: Coherent, Inc., Santa Clara, Calif.

[21] Appl. No.: 816,258

[22] Filed: Mar. 13, 1997

Related U.S. Application Data

[63] Continuation of Ser. No. 494,094, Jun. 23, 1995, abandoned.

[51] Int. Cl.$^6$ ............................................. H01S 3/04
[52] U.S. Cl. ...................................................... 372/34
[58] Field of Search .................................. 372/34, 36, 38

[56] References Cited

U.S. PATENT DOCUMENTS

| | | | |
|---|---|---|---|
| 4,737,798 | 4/1988 | Lonis et al. | 346/1.1 |
| 5,027,360 | 6/1991 | Nabors et al. | 372/18 |
| 5,392,303 | 2/1995 | Shiozawa et al. | 372/34 |
| 5,400,351 | 3/1995 | Montgomery et al. | 372/34 |

FOREIGN PATENT DOCUMENTS

| | | | |
|---|---|---|---|
| 0 618 653 A3 | 10/1994 | European Pat. Off. | H01S 3/133 |
| 37 06 635 A1 | 9/1988 | Germany | H01S 3/133 |
| 40 39 371 A1 | 6/1992 | Germany | H01S 3/133 |
| 2 224 374 | 5/1990 | United Kingdom | G05D 23/19 |
| WO 95/29521 | 11/1995 | WIPO | H01S 3/133 |

OTHER PUBLICATIONS

W. Lenth, "High Frequency Heterodyne Spectroscopy with Current-Modulated Diode Lasers," *IEEE Journal of Quantum Electronics*, vol. QE-20, No. 9, Sep. 1984, pp. 1045-1050.

A. Sollberger, A. Heinamaki & H. Melchior, "Frequency Stabilization of Semiconductor Lasers for Applications in Coherent Communication Systems," *Journal of Lightwave Technology*, vol. LT-5, No. 4, Apr. 1987, pp. 485-491.

H.S. Lee et al., "Frequency Stabilization of a Directly Modulated Semiconductor Laser", Review of Scientific Instruments, vol. 61, No. 9, Sep. 1990, New York.

H. Ludvigsen et al., "Heterodyne Frequency Measurments of a Voltage-Controlled Diode Laser", IEEE Transactions On Instrumentation and Measurment, vol. 42, No. 2, Apr. 1993, New York.

Coherent advertising brochure, "DPSS 532 Diode-Pumped Nd: YAG Laser." Oct. 1991, one page (2 sided) in length.

Coherent, advertising brochure, "DPSS 532-400 Diode-Pumped Nd:YAG Laser." Jul. 1994, one page (2-sided) in length.

Coherent, advertising brochure, DPSS 1064 Diode-Pumped Nd:YAG Laser, Dec. 1991, one page (2-sided) in length.

Coherent advertising brochure, "D$^3$ 430 Directly Doubled Diode Laser," Oct. 1994, one page (2-sided) in length.

Coherent advertising brochure booklet, "Directly Doubled Diode Laser," Dec. 1994, four pages in length.

Coherent advertising brochure booklet, "DPSS 532 Solid-State Lasers,"Dec. 1991, four pages in length.

*Primary Examiner*—Rodney B. Bovernick
*Assistant Examiner*—Robert E. Wise
*Attorney, Agent, or Firm*—Limbach & Limbach L.L.P.

[57] ABSTRACT

Laser diode circuitry that controls the laser diode temperature as a function of laser diode current. Changes in the spectral output of the laser diode directly caused by adjustments to the operating current of the laser diode are offset by corresponding changes in the diode temperature. Diode temperature regulation circuitry automatically changes the diode temperature by monitoring the diode operating current. Alternately, when the diode current is adjusted to intentionally shift the spectral output of the diode, for example to maintain a frequency match to an external cavity resonance, the temperature regulation circuitry automatically changes the diode temperature to induce an additional spectral shift in the same direction, thereby inducing a current adjustment in the opposite direction that prevents large excursions in the amplitude of the operating current of the diode.

17 Claims, 5 Drawing Sheets

TEMPERATURE CORRECTION CIRCUIT FOR WAVELENGTH STABILIZATION IN A LASER DIODE

This is a continuation of application Ser. No. 08/494,094 filed on Jun.23, 1995 now abandoned.

FIELD OF THE INVENTION

The present invention relates to diode lasers, and in particular to diode current and temperature control circuits used to operate laser diodes.

BACKGROUND OF THE INVENTION

The optical output of a laser diode is variable in amplitude and in wavelength. The amplitude of the diode energy output is a function of the operating electrical current (drive current) passing through the laser diode's junction. The spectral output of a laser diode is a function of the temperature of the diode's junction and the laser diode drive current. Therefore, changes in diode temperature and/or drive current shift the spectral output of the laser diode.

It is well known in the art to adjust the temperature of a laser diode to obtain a specific wavelength. Laser diodes are typically mounted on a thermoelectric cooler operated by temperature regulatory circuitry that maintains the diode temperature at a preset value. The preset temperature is determined such that, at a predetermined operating drive current, the laser diode produces a laser beam having the desired amplitude and spectral output. For example, in a 4 watt gallium aluminum arsenide laser diode from Spectra Diode Labs, a change in the diode temperature of 1° C. results in a spectral shift of the diode output of about 0.27–0.30 nm.

When laser diodes were first developed, only low power laser diodes were available. The spectral shift caused by changes in the drive current in a low power laser diode is negligible for most applications. A low power laser diode uses drive currents of about 500–700 mA, with a dynamic range of about 300 mA to 700 mA, to produce hundreds of milliwatts of laser power. Therefore, the corresponding shift in the spectral output caused by a drive current adjustment of several hundred milliamps is relatively low. Further, a low power diode is typically run at or near its maximum rated drive current, thus not utilizing its full dynamic range during operation.

More recently, higher power laser diodes have been developed that can operate at higher drive currents, such as 6 amps, to produce around 5 watts of output power. A high power laser diode has a dynamic range of several amps. The spectral shift caused by a change or adjustment in the drive current of several amps is significant, which is problematic for those applications that are intolerant of significant spectral shifts, yet need to exploit the high dynamic range of the laser diode. For example, in the 4 watt Spectra Diode Labs laser diode, a change in the drive current of 3 amps can result in a spectral shift of the diode output of about 2.6 nm (assuming a fixed diode temperature).

One common application of high power laser diodes is to optically pump a gain medium in an external optical cavity with the diode optical output. The temperature of the diode is set to optimally match its spectral output with the absorption spectrum of the gain medium. However, if the drive current is subsequently changed significantly without a change in diode temperature, laser diode spectral output will shift away from the optimal absorption spectrum of the gain medium. The mismatch of spectral output and optimal absorption spectrum results in lower external cavity efficiency.

A runaway condition can result from the reduced efficiency of the external cavity if a light regulation loop is used to maintain a constant output power. As the diode or external cavity degrades over its lifetime, the drive current will be increased by the light loop to maintain a specified output power. The increase in drive current shifts the spectral output of the laser diode thus reducing the laser system efficiency, which requires more drive current through the diode to maintain laser system output power. The continuing increase in current intended to increase the output power serves to further increase the spectral mismatch of the diode and the gain medium, and results in a shorter laser system lifetime. The runaway condition is most severe with gain media having a narrow absorption spectra. Further, such a runaway condition would automatically occur with laser diode systems that use light regulation loops, which sample the external cavity output power and automatically adjust the drive current to maintain a constant external cavity output power level.

A further complication caused by the mismatch of the diode spectral output and the gain medium's optimal absorption spectrum is that the laser diode output will penetrate deeper into the gain medium. The newly excited portion of the gain medium can support secondary modes in the external cavity, thus further reducing the external cavity efficiency.

In another application, a single frequency laser diode is used to pump an external optical cavity, where the diode spectral output is locked to a resonant frequency of the external cavity. As this resonant frequency drifts, the drive current is adjusted to shift the spectral output of the diode to track the drifting resonant frequency. However, large excursions in the drive current of a single frequency laser diode induce the diode to mode hop. Therefore, if the resonant frequency of an external cavity drifts too far in one direction, the diode will mode hop, causing a temporary loss in system output power for the time required to relock the diode spectral output to a resonant frequency.

A prior art solution to keep the drive current relatively constant while maintaining lock on a drifting resonant frequency is to mount one of the external cavity optics on a PZT to eliminate large drifts in the external cavity resonance. The PZT device varies the cavity length of the external cavity to prevent large changes in the resonant frequency. This limits the amount of drive current excursion required during operation. The PZT solution, however, adds to the complexity and cost of the external optical cavity.

There is a need to automatically reduce the spectral shift of a laser diode as the drive current is changed or adjusted. There is also a need to reduce the excursions in the drive current of a single frequency laser diode that is locked to an external cavity resonance.

SUMMARY OF THE INVENTION

The present invention solves the aforementioned problems by automatically changing the diode temperature when the drive current is adjusted.

The preferred embodiment includes a laser diode and a current driver for supplying a variable electrical drive current to the diode to produce an output laser beam. The spectral output of the laser beam is a function of the temperature of the diode and the drive current supplied thereto. A current sensor senses the amplitude of the drive current. A temperature regulation circuit regulates the temperature of the diode up and down depending upon any amplitude changes in the drive current sensed by the current sensor. The temperature changes offset the spectral shift in the diode output caused by the adjustment to the drive current.

In a second embodiment, an external cavity having a resonance is optically pumped by the output laser beam from the diode to produce a second laser beam. A resonance sensor senses how close the spectral output of the diode is to being optimally matched to the peak of the external cavity resonance. The current driver is responsive to the resonance sensor such that the drive current is adjusted to shift the spectral output of the diode to optimally match the external cavity resonance. The temperature regulation circuit regulates the temperature of the diode and changes the diode temperature to cause an additional spectral shift in the output laser beam that is in the same direction as the spectral shift caused by the adjustment to the drive current. The additional spectral shift allows the current driver to return the drive current to within an optimal operational range. Such temperature regulation prevents large excursions in drive current while the diode output is matched to the external cavity.

Other objects and features of the present invention will become apparent by a review of the specification, claims and appended figures.

BRIEF DESCRIPTION OF THE DRAWINGS

FIG. 4b is a simplified schematic diagram of an alternate embodiment to the embodiment shown in FIG. 4a.

DETAILED DESCRIPTION OF THE PREFERRED EMBODIMENTS

The present invention is a temperature control loop that automatically changes the temperature of a laser diode in response to adjustments made to the drive current passing through the laser diode.

Figure 1:
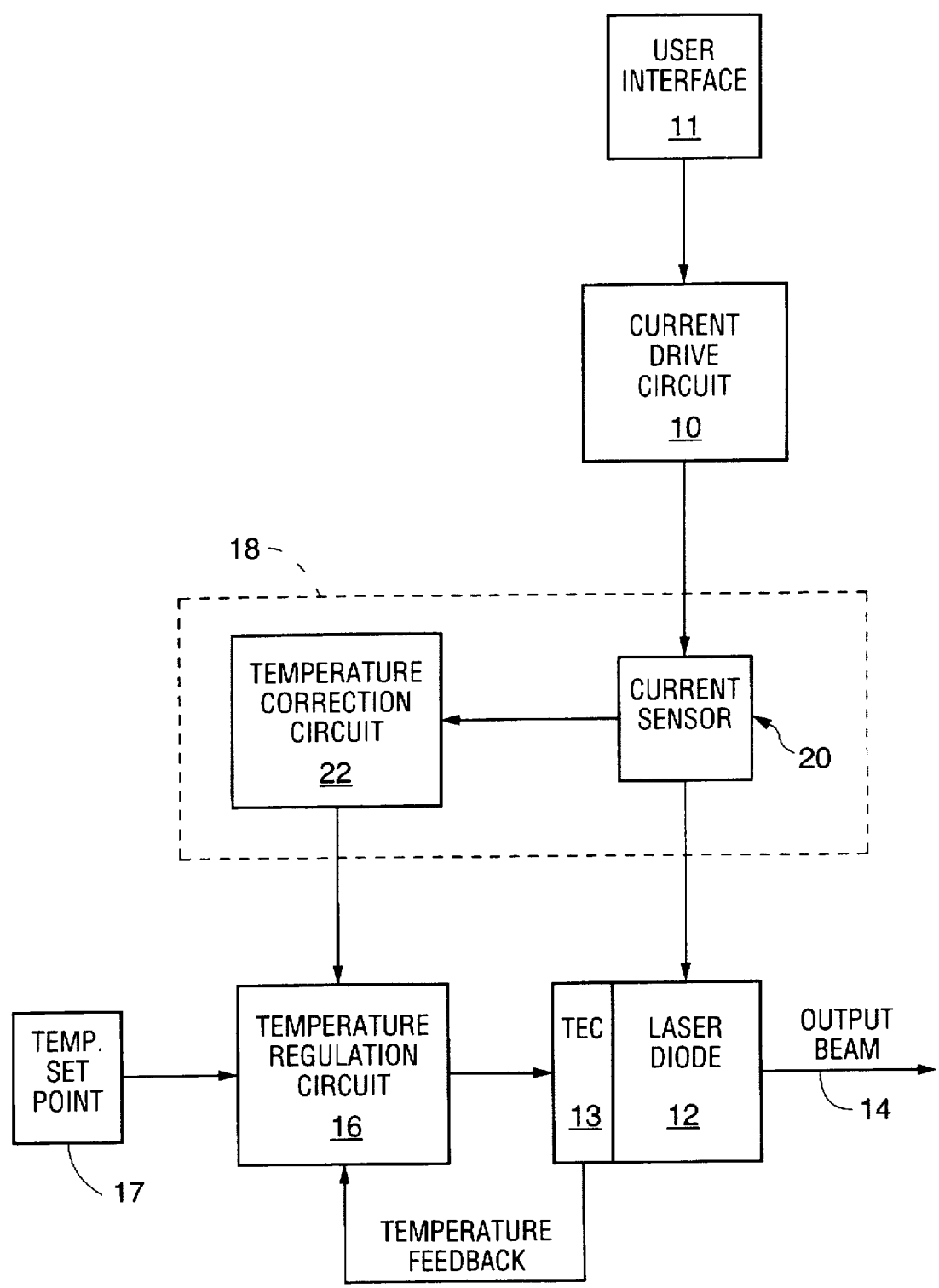
FIG. 1 is a simplified schematic diagram of the preferred embodiment of the laser diode system of the present invention.

A temperature controlled laser diode system of the preferred embodiment is illustrated in FIG. 1. A current drive circuit 10 supplies an electrical drive current to a laser diode 12 to produce an output laser beam 14. The current drive circuit 10 has an internal preset operating setting, and/or a user interface 11 which can adjust the drive current supplied by the current driver circuit 10 to the laser diode 12. The laser diode 12 is mounted to a thermo-electric cooler 13, which is operated by the temperature regulation circuit 16 utilizing temperature feedback from the thermo-electric cooler 13. The initial temperature of the laser diode 12 is regulated at a predetermined set-point temperature, as determined by a user input 17, to produce the desired spectral output.

If the temperature of the diode 12 is held constant at the set-point temperature while the drive current is adjusted, the spectral output of the diode will shift away from the desired value. To maintain the desired spectral output after the drive current has been adjusted, a temperature correction loop 18 is added to the diode system. Temperature correction loop 18 includes a current sensor 20 that senses the amplitude of the drive current supplied to the laser diode 12, and a temperature correction circuit 22 that supplies a temperature correction signal to the temperature regulation circuit 16 in response to the current sensor 20. The temperature regulation circuit 16 changes the temperature of the diode 12 away from the setpoint temperature in response to the signal from the temperature correction circuit 22.

In operation, the values of the set-point temperature and the initial drive current are set to produce an output laser beam 14 having a desired power level and spectral output. When the current drive circuit 10 adjusts the drive current, for example to maintain output power, the current sensor 20 senses the drive current adjustment, and the temperature correction circuit 22, using a predetermined correction factor, automatically causes the temperature regulation circuit 16 to change the temperature of the diode 12 away from the initial set-point temperature. The change in temperature causes a spectral shift in the output beam 14 that partially or completely offsets the spectral shift induced by the adjustment in the drive current. Therefore, if the diode spectral output is shifted in one direction by a adjustment in the drive current, the diode temperature is automatically changed to induce a spectral shift in the opposite direction.

The correction factor used by the temperature correction circuit 22 can be empirically and theoretically determined based upon the desired spectral output, an initial setting of the drive current, and the particular spectral shift that results from a change in drive current and diode temperature. In a present commercial embodiment, a 4 watt gallium aluminum arsenide laser diode from Spectra Diode Labs has been used. This diode has a dynamic range of about 2–6 amps to supply an output beam of 0–4 watts. As noted above, the spectral output of this diode shifts about 0.86 nm for a drive current change of 1 amp, or a temperature change of 2.86° C. It was found that a change in temperature of −2.86° C./amp by the temperature correction loop 18 will almost completely offset the spectral shift in the output beam 14 caused by an adjustment in the drive current. This value will vary from diode to diode. Therefore, for optimal results, the temperature correction circuit 22 should be calibrated with a calibration factor specific to the particular diode 12 being used.

Figure 2:
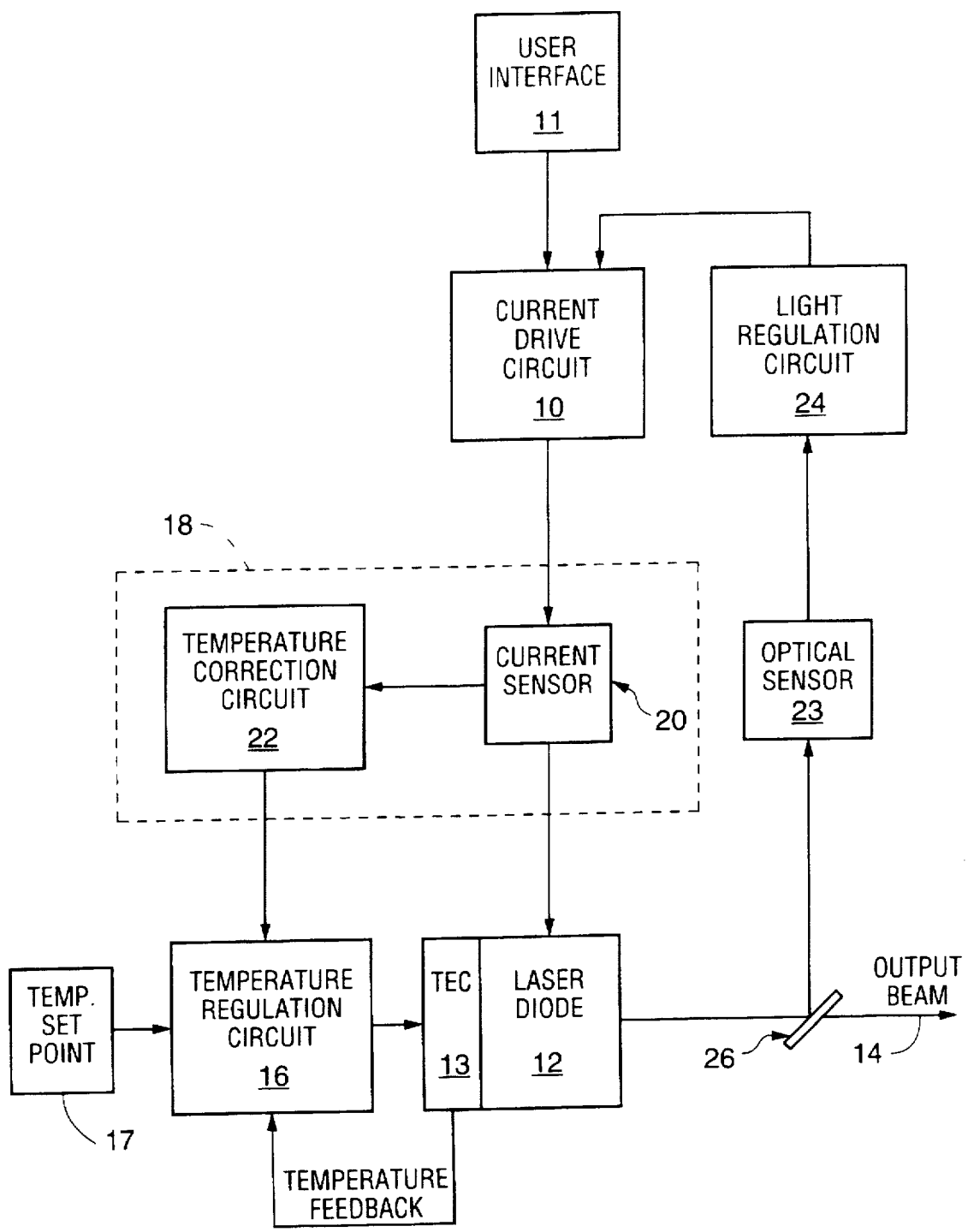
FIG. 2 is a simplified schematic diagram of the preferred embodiment shown with a light regulation circuit.

A light regulation circuit 24 can be added to the preferred embodiment, as shown in FIG. 2. A light pick-off 26 directs a small portion of the beam 14 to an optical sensor 23. The light regulation circuit 24 uses the signal from the sensor 23 to create a signal proportional to the amplitude of the output beam 14. The current drive circuit 10 uses the signal from the light regulation circuit 24 to adjust the drive current to maintain a constant amplitude output beam 14. Alternately, the optical sensor 23 can be mounted to the laser diode to detect optical leakage from the diode which is indicative of the amplitude of the output beam 14.

Figure 3:
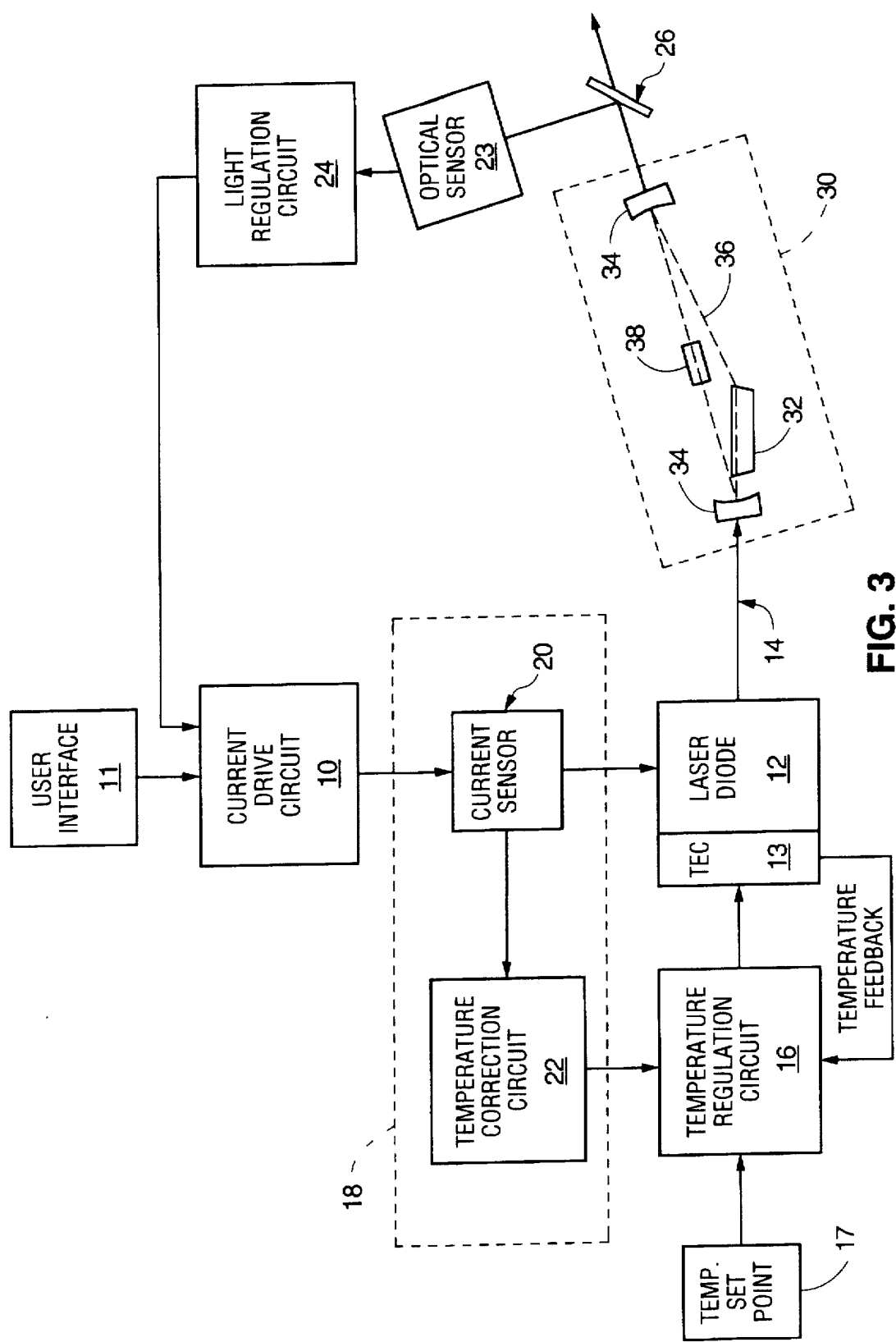
FIG. 3 is a simplified schematic diagram of the preferred embodiment shown with an external cavity pumped by the diode laser output beam.

An external cavity 30 can be added to the diode configuration of FIG. 2, as shown in FIG. 3. The external cavity 30 includes a gain medium 32, and reflective optics 34. The laser diode output beam 14 excites the gain medium 32 to generate a cavity laser beam 36 inside the cavity 30. The beam 36 exits one of the reflective optics 34, or is used to excite a non-linear crystal 38 to create a doubled laser beam. An optical cavity of this type is described in more detail in U.S. Pat. No. 5,052,815, which was issued in October of 1991. A small part of the cavity output beam is directed to the light regulation circuit 24 by the light pick-off 26.

In the configuration shown in FIG. 3, the setpoint temperature of the laser diode 12 is set such that the laser diode spectral output at a predetermined drive current optimally matches the optimal absorption spectrum of the gain medium 32. At that drive current, the diode output beam 14 is properly absorbed by the gain medium 32 for optimal external cavity efficiency. The light regulation circuit 24 adjusts the drive current to maintain a constant amplitude output power from the external cavity 30. Over time, the output of the cavity may drop as a result of degradation of the diode 12 or contamination or misalignment of the external cavity 30. As the drive current is adjusted away from its predetermined value to compensate for lost output power, the temperature correction circuit 22 automatically changes the temperature of the diode 12 in response to the drive current adjustment, thus offsetting the spectral shift caused by the adjustment to the drive current. Therefore, the drive current can be adjusted while not significantly shifting the diode spectral output away from the optimal absorption spectrum of the gain medium 32, thus avoiding a runaway condition.

Figure 4A:
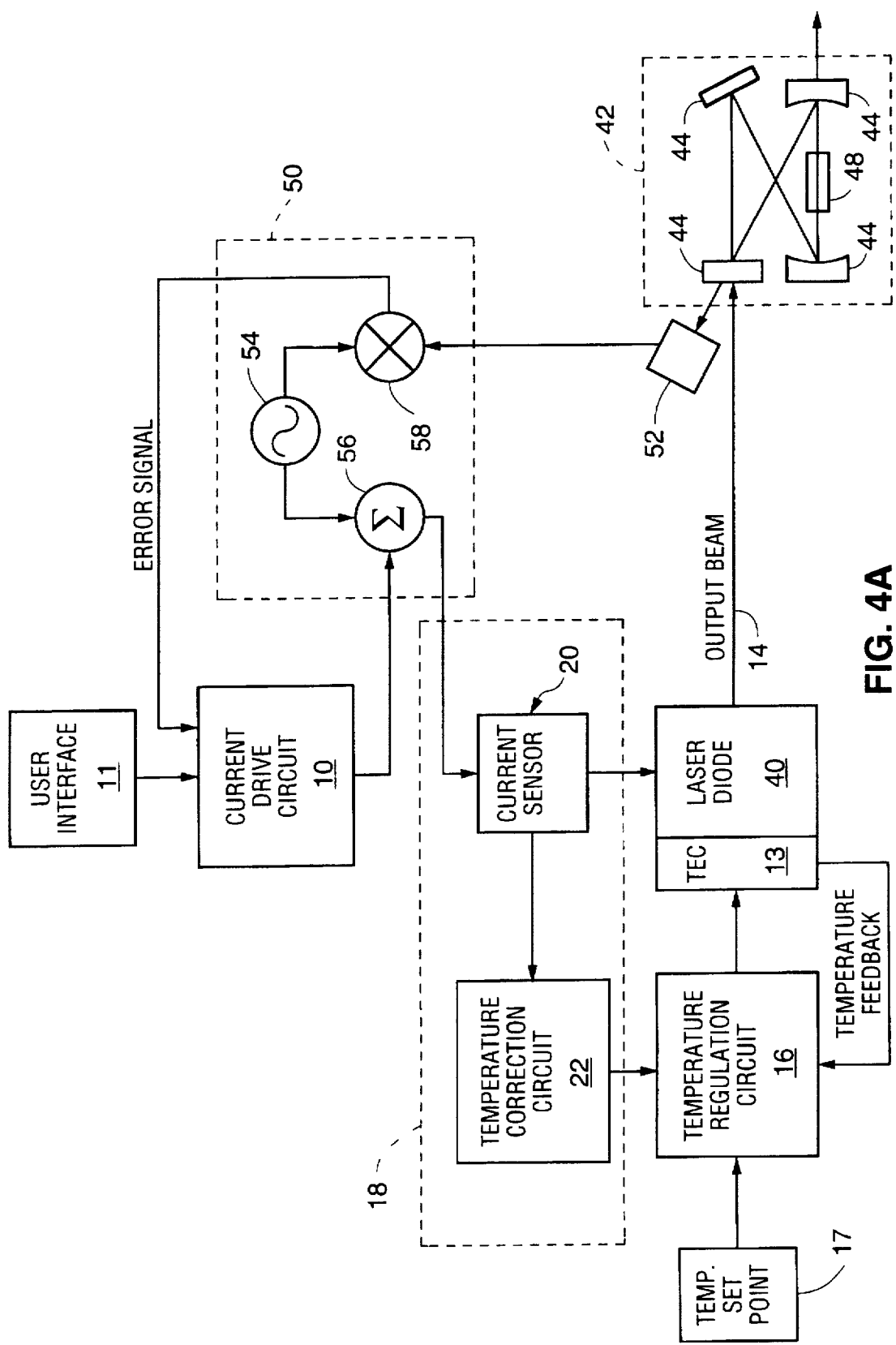
FIG. 4a is a simplified schematic diagram of a second embodiment of the present invention.

The temperature correction loop 18 can also be used in other systems where a laser diode is used as a pump source. FIG. 4a shows a system that uses a single frequency laser diode 40 to optically energize an external single frequency optical cavity 42. The external cavity 42 includes reflective optics 44, and a non-linear crystal 48. The external cavity produces frequency doubled light from the non-linear crystal 48. One of the reflective optics 44 passes the frequency doubled light out of the external cavity 42, and one of the reflective optics 44 passes a small portion of the external cavity optical power to an RF sensor 52.

A frequency modulation circuit 50 locks the diode spectral output to an external cavity resonance by the Pound-Drever method of FM locking. An oscillator 54 induces a modulation in the drive current at a fixed frequency, such as 300 MHz, through the summation circuit 56. The modulation introduces higher and lower frequency sidebands onto the output beam of the diode 40. The sidebands are outside the linewidth of the cavity resonance and therefore are not coupled to the doubled output of the cavity 42, but are sensed by the RF sensor 52. The signal from the oscillator is mixed with the signal from the RF sensor by mixer 58 to produce an error signal. The error signal is sent to the current drive circuit 10 to adjust the drive current to maintain sidebands of equal amplitude, thus locking the diode spectral output to the peak of the cavity resonance.

During operation, the drive current is continually adjusted to vary the spectral output of the diode 40 to maintain lock onto the external cavity resonance. Large excursions in the drive current caused by a drifting external cavity 42, however, will induce the single frequency diode 40 to mode hop. A mode hop will result in a loss of lock on the external cavity resonance, a temporary loss of system output power, as well as lost operating time necessary to relock the diode 40 to a new external cavity resonance.

To prevent large excursions in drive current, and therefore prevent diode mode hops, the diode temperature is also continually adjusted in response to drive current changes. The temperature correction circuit 22 induces a diode temperature change in response to a detected drive current adjustment. Such a temperature change results in a laser diode spectral shift in the same direction as the spectral shift caused by the drive current adjustment. Therefore, this additional spectral shift will cause the FM circuit 50 to induce a drive current adjustment in the opposite direction as the initial drive current adjustment to maintain lock on the external cavity resonance. The drive current is adjusted to induce quick spectral shifts in the output of the laser diode to maintain lock onto the external cavity resonance, while the diode temperature is adjusted to induce slower spectral shifts that induces the drive current to return to an optimal range thereby preventing large drive current excursions that could cause the laser diode to mode hop. While large temperature changes in the diode 40 will also induce mode hops, temperature induced mode hops occur less frequently than if the drive current was used to maintain lock on the external cavity resonance.

Figure 4B:
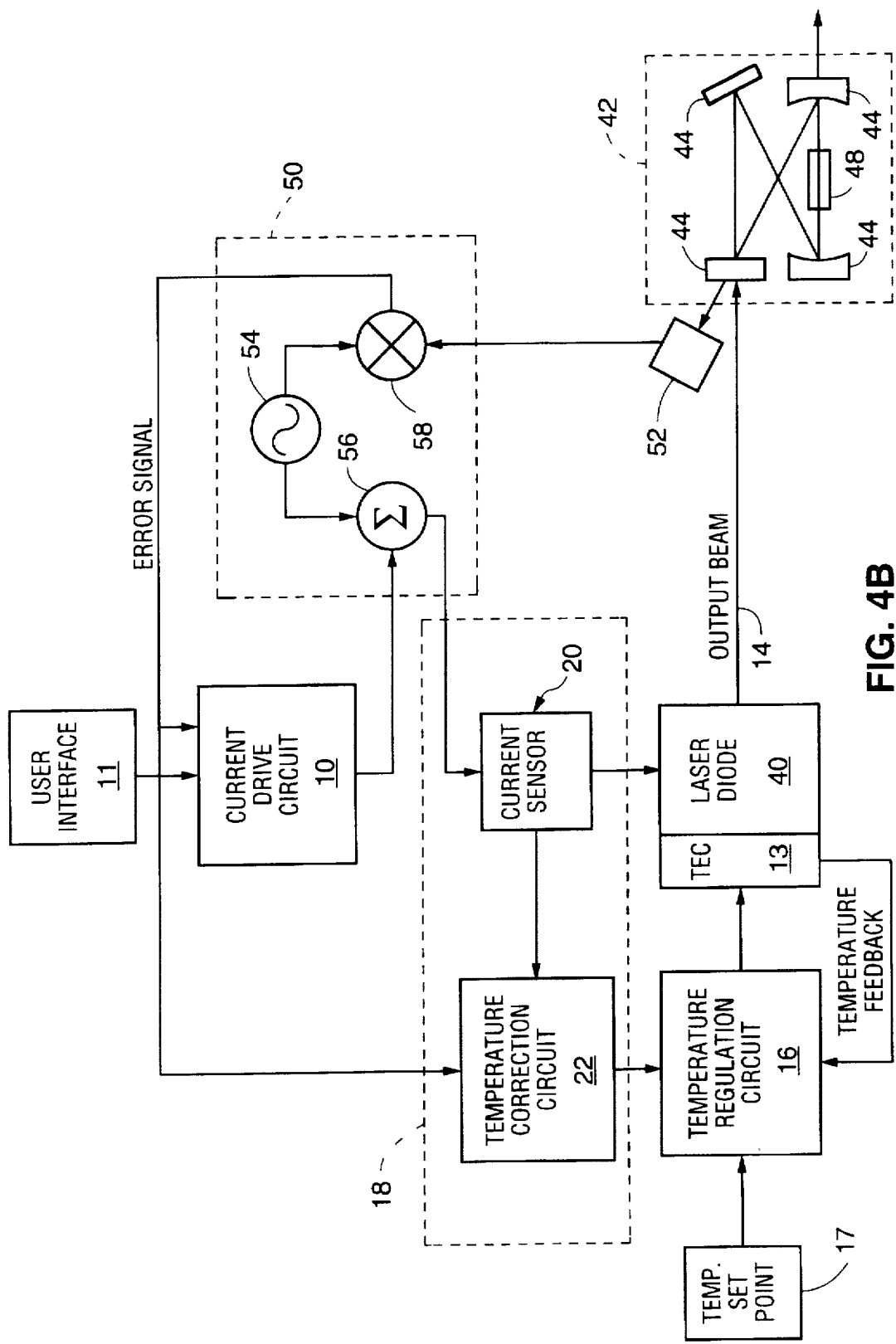

In an alternate embodiment of the single frequency embodiment shown in FIG. 4a, the error signal from mixer 58 can be sent directly to the temperature correction circuit 22, as shown in FIG. 4b. The temperature correction circuit 22 changes the temperature of the laser diode 40 directly in response to the error signal. If the user interface 11 is not used to change the diode current, the current sensor 20 in this embodiment can be eliminated.

The present invention is not limited to the Pound-Drever method of FM locking. Any appropriate means for sensing the cavity resonance can be used to adjust the drive current to maintain lock on the external cavity resonance. For example an external etalon can be used to sense the spectral mismatch between the diode 40 and the external cavity 42.

It is to be understood that the present invention is not limited to the embodiments described above and illustrated herein, but encompasses any and all variations falling within the scope of the appended claims. For example, the sensing circuit 20 can be integral with the current drive circuit 10. Further, each circuit, or all the circuits, of the present invention can be embodied in integrated circuits. Additionally, external cavities can incorporate just the reflective optics, and/or a gain medium, and/or non-linear crystals, as well as other elements not disclosed herein. Finally, the thermoelectric cooler could be replaced by any circuit or device that can accurately regulate the temperature of the diode.

What is claimed is:

1. A laser diode system, comprising:

a laser diode;

current drive means for supplying a variable electrical drive current to the diode to produce an output laser beam, wherein the spectral output of the laser beam is a function of the temperature of the diode and the drive current supplied thereto;

drive current adjustment means for adjusting the amplitude of the drive current supplied by the current drive means to the diode; and current sensing means for sensing the amplitude of the drive current; and temperature regulation means for variably regulating the temperature of the diode, the temperature regulation means being responsive to the current sensing means wherein the temperature regulation means is an electrical circuit incorporating a correction factor that corresponds to a predetermined temperature change required to compensate for a given change in drive current so that the total spectral shift in the output beam of the diode is minimized and wherein the temperature regulation means functions to increase the temperature of the diode based upon the correction factor in response to a decrease in the drive current sensed by the current sensing means and functions to decrease the temperature of the diode according to the correction factor in response to an increase in the drive current sensed by the current sensing means and wherein the drive current adjustment means includes light regulation means for sensing the amplitude of the output laser beam, and wherein the current drive means is responsive to the light regulation means such that the drive current is adjusted to maintain a substantially constant output laser beam amplitude.

2. The laser diode system of claim 1, wherein the drive current adjustment means further includes a user interface.

3. The laser diode system of claim 1, wherein the temperature regulation means further includes a set point means for setting the temperature regulation means to regulate the temperature of the diode at a predetermined set point temperature for a predetermined drive current, wherein when the drive current is adjusted away from the predetermined drive current, the temperature regulation means changes the temperature of the diode away from the predetermined set point temperature to offset the spectral shift caused by the adjustment of the drive current away from the predetermined drive current.

4. A laser diode system comprising:
a laser diode;
current drive means for supplying a variable electrical drive current to the diode to produce an output laser beam, wherein the spectral output of the laser beam is a function of the temperature of the diode and the drive current supplied thereto;
drive current adjustment means for adjusting the amplitude of the drive current supplied by the current drive means to the diode; and
current sensing means for sensing the amplitude of the drive current;
the drive current adjustment means includes temperature regulation means for variably regulating the temperature of the diode, the temperature regulation means being responsive to the current sensing means wherein an adjustment in the drive current shifts the spectral output of the laser beam in one direction, and the temperature regulation means in response to the change in drive current sensed by the sensing means changes the temperature of the laser diode to induce a shift in the spectral output of the laser beam in the same direction to the one direction, whereby the drive current is adjustable to shift the spectral output of the laser beam in the opposite direction to said one direction.

5. The laser diode system of claim 4, wherein the temperature regulation means increases the temperature of the diode in response to an increase in the drive current sensed by the current sensing means, and the temperature regulation means decreases the temperature of the diode in response to a decrease in the drive current sensed by the current sensing means.

6. The laser diode system of claim 5, further comprising:
an external cavity, having a resonance, that is optically pumped by the output laser beam from the diode to produce a second laser beam;
resonance sensing means for sensing the difference between the spectral output of the diode and the peak of the external cavity resonance, wherein the current drive means is responsive to the resonance sensing means to adjust the drive current to shift the spectral output of the diode to optimally match the external cavity resonance; and
the temperature regulation means being responsive to the current sensing means such that the temperature of the diode is changed to cause an additional spectral shift in the output laser beam that is in the same direction as the spectral shift caused by the adjustment to the drive current.

7. The laser diode system of claim 6, wherein the laser diode is a single frequency laser diode.

8. The laser diode system of claim 7, wherein the laser resonance sensing means includes:
means for modulating the drive current to produce sidebands in the output laser beam;
means for sensing the sidebands;
means for creating an error signal from the side bands, the current drive being responsive to the error signal to change the drive current to shift the spectral output of the diode to maintain optimal match with the external cavity resonance.

9. The laser diode system of claim 5, further comprising:
an external cavity, having a resonance, that is optically pumped by the output laser beam from the diode to produce a second laser beam;
resonance sensing means for sensing the difference between the spectral output of the diode and the peak of the external cavity resonance, wherein the current drive means is responsive to the resonance sensing means to adjust the drive current to shift the spectral output of the diode to optimally match the external cavity resonance; and
the temperature regulation means being responsive to the resonance sensing means such that the temperature of the diode is changed to cause an additional spectral shift in the output laser beam that is in the same direction as the spectral shift caused by the adjustment to the drive current.

10. A laser diode system, comprising:
a laser diode;
current drive means for supplying a variable electrical drive current to the diode to produce an output laser beam, wherein the spectral output of the laser beam is determined by the temperature of the diode and the drive current therethrough;
drive current adjustment means for adjusting the amplitude of the drive current supplied by the current drive means to the diode; current sensing means for sensing the amplitude of the drive current;
a temperature correction means responsive to the current sensing means for producing a temperature correction signal, the temperature correction means is an electrical circuit incorporating a correction factor that corresponds to a predetermined temperature change required to compensate for a given change in drive current so that the total spectral shift in the output beam of the diode is minimized; and
temperature regulation means for variably regulating the temperature of the diode, the temperature regulation means being responsive to the temperature correction signal wherein the temperature regulation means functions to increase the temperature of the diode based upon the correction factor in response to a decrease in the drive current sensed by the current sensing means, and the temperature regulation means functions to decrease the temperature of the diode based upon the correction factor in response to an increase in the drive current sensed by the current sensing means, and wherein the drive current adjustment means includes light regulation means for sensing the amplitude of the output laser beam, and wherein the current drive means is responsive to the light regulation means such that the drive current is adjusted to maintain a substantially constant output laser beam amplitude.

11. The laser diode system of claim 10, further comprising:

a set point means for inputting a predetermined setpoint temperature at which the temperature regulation means will regulate the temperature of the diode, the setpoint temperature corresponding to a predetermined drive current, wherein the temperature regulation means changes the diode temperature away from the setpoint temperature when the drive current is adjusted away from the predetermined drive current to offset the shift in the spectral output of the laser beam caused by adjustment of the drive current.

12. The laser diode system of claim 11, wherein an adjustment in the drive current shifts the spectral output of the laser beam in one direction, and the temperature regulation means in response to the change in drive current sensed by the sensing means changes the temperature of the laser diode to induce a shift in the spectral output of the laser beam in an opposite direction to the one direction.

13. The laser diode system of claim 12, wherein the drive current adjustment means further includes a user interface.

14. A method of minimizing the shift of the spectral output of a laser diode, comprising the steps of:

driving current through a laser diode to produce a diode output laser beam;

regulate the temperature of the laser diode;

adjusting the drive current in response to the diode output laser beam to maintain a constant amplitude thereof; and changing the temperature of the diode in response to the current adjustment based upon a correction factor that corresponds to the required temperature change for a given change in drive current to minimize the total spectral shift in the output beam of the diode caused by a change in drive current and the corresponding change in diode temperature.

15. The method of claim 14, wherein in the temperature change step, the temperature of the diode is increased in response to a decrease in the drive current, and the temperature of the diode is decreased in response to an increase in the drive current.

16. A method of minimizing drive current drift in a laser diode, comprising the steps of:

driving current through a laser diode to produce a diode output laser beam;

optically pumping an external cavity with the diode output laser beam to produce a cavity output laser beam; adjusting the drive current in response to an output parameter of said cavity;

regulating the temperature of the laser diode;

changing the regulated temperature of the diode in response to the current adjustment wherein the temperature of the diode is decreased in response to a decrease in the drive current, and the temperature of the diode is increased in response to an increase in the drive current.

17. The method of claim 16 wherein the output parameter is the resonant frequencies of the external cavity and in the adjusting step, the drive current is adjusted in response to an external cavity resonance to lock the spectral output of the diode onto a resonant frequency of the external cavity.

* * * * *